United States Patent
Erickson

(10) Patent No.: US 6,334,208 B1
(45) Date of Patent: Dec. 25, 2001

(54) METHOD AND APPARATUS FOR IN-SYSTEM PROGRAMMING WITH A STATUS BIT

(75) Inventor: Brian D. Erickson, Soquel, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/372,349

(22) Filed: Aug. 11, 1999

(51) Int. Cl.$^7$ .............................. G06F 7/38; H03K 19/173

(52) U.S. Cl. ............................................. 716/17; 326/37

(58) Field of Search ................... 716/1, 16, 17; 326/37, 38, 101, 39, 41, 46, 47

(56) References Cited

U.S. PATENT DOCUMENTS

| | | | |
|---|---|---|---|
| 5,028,821 | 7/1991 | Kaplinsky | 307/465 |
| 5,530,378 | 6/1996 | Kucharewski, Jr. et al. | 326/41 |
| 5,617,041 | 4/1997 | Lee et al. | 326/39 |
| 5,805,607 | * 9/1998 | Khu | 371/22.31 |
| 6,134,707 | * 10/2000 | Herrmann et al. | 717/5 |

OTHER PUBLICATIONS

Ting et al., "A 50–ns CMOS 256K EEPROM," IEEE Journal of Solid–State Circuits, vol. 23, No. 5, Oct. 1988, pp. 1164–1170.*

"The Programmable Logic Data Book", 1998, published by and available from Xilinx, Inc., 2100 Logic Drive, San Jose, California 95124, pp. 3–5 to 3–19.

* cited by examiner

Primary Examiner—Matthew Smith
Assistant Examiner—Leigh Marie Garbowski
(74) Attorney, Agent, or Firm—Bever Hoffman & Harms, LLP

(57) ABSTRACT

Apparatus and method for programming a programmable logic device (PLD) using a status bit to indicate whether in-system programming (ISP) has been completed. Complex electronic systems often use PLDs to interface to other elements of the system and to the outside environment. Such PLDs are reprogrammed by the system controller using the boundary-scan/JTAG access port, but a power failure may cause an unwanted termination of the programming cycle before all of the PLD internal logic, connections, and functional I/O pins are properly programmed. In such a situation, some or all of the PLD functional (input/output) pins could be driven to erroneous states such that other devices connected to them would be damaged or prevented from operating correctly. The status indicator is set to hold all PLD functional pins in a high impedance condition (tri-state) until programming or another non-mission mode of PLD operation is successfully concluded. Additionally, selected driver elements within the PLD can be disabled in the same way. In the event of an unexpected loss of power, the status indicator causes all PLD functional pins to come up in tri-state on restoration of power and therefore be unable to assert control of any other connected devices or busses. Likewise, selected drivers can also be disabled to prevent similar contention problems.

9 Claims, 9 Drawing Sheets

METHOD AND APPARATUS FOR IN-SYSTEM PROGRAMMING WITH A STATUS BIT

BACKGROUND OF THE INVENTION

1. Field of the Invention

The present invention relates to programmable logic devices (PLDs) and in particular to a method and apparatus for programming programmable logic devices.

2. Description of the Related Art

Programmable logic devices (PLDs) are a class of integrated circuits which can be programmed by a user to implement user defined logic functions. PLDs, long known in the art, are often used in electronic systems because, unlike custom "hard-wired" logic circuits or application specific integrated circuits (ASICs), PLDs can be programmed and reprogrammed quickly to incorporate modifications to the implemented logic functions.

One major class of PLDs are referred to as programmable logic array (PLA) devices or programmable array logic (PAL) devices. Basically, these early PLDs include an AND plane which logically ANDs two or more input signals to produce product terms (P-terms), and an OR plane which logically ORs two or more of the P-terms generated by the AND plane. ("Plane" here generally refers to a grouping of logic gates and not to a geometric plane.) The AND plane is typically a matrix of programmable connections where each column connects to an input pin of the PLD, and each row forms a P-term which is transmitted to the OR plane. The OR plane may be programmable (i.e., each P-term is programmably connectable to one of several different OR plane outputs), in which case the PLD is referred to as a PLA device. Alternatively, the OR plane may be fixed (i.e., each P-term is assigned to a particular OR plane output), in which case the PLD is referred to as a PAL device. The AND plane and OR plane of PLA and PAL devices implement logic functions represented in the sum-of-products form.

PLA and PAL devices were well-received by logic designers when their implemented logic functions were relatively small. However, as logic functions grew increasingly larger and more complex, logic designers were required to wire together two or more small PLDs to provide sufficient logic capacity. Although this process was tolerated during development and testing, it increased the cost and size of production units. This generated a demand for PLDs with increasingly larger logic capacity.

To meet the ever-increasing demand for greater capacity, PLDs with increasingly complex architectures have been developed. One popular complex PLD type, known as complex programmable logic devices (CPLDs), includes two or more function blocks connected together and to input/output (I/O) modules by an interconnect matrix such that each of the function blocks selectively communicates with the I/O modules and with other function blocks of the CPLD through the interconnect matrix. External pins on the device connected to the I/O modules are also referred to as functional pins.

Each function block of the CPLD is structured like the two-level PLDs, described above. In effect, CPLDs incorporate several early PLDs and associated connection circuitry onto a single integrated circuit. This provides a circuit designer the convenience of implementing a complex logic function using a single IC.

Each function block of an early CPLD typically includes an AND array and a set of macrocells. The AND array includes a set of input lines for receiving input signals from the interconnect matrix, and a set of product term (P-term) lines for transmitting P-term signals to the macrocells. Each P-term line is connected to the input lines using programmable connections which allow logic ANDing of two or more of the input signals. Each macrocell includes an OR gate which is programmable to receive one or more of the P-term signals transmitted on the P-term lines. The OR gate of each macrocell produces a sum-of-products term which is either transmitted to the I/O modules of the CPLD, fed back through the interconnect matrix, or is transmitted on special lines to an adjacent macrocell.

Some CPLDS, such as XC7300 series CPLDs and XC9500 series CPLDs produced by Xilinx, Inc. of San Jose, Calif., incorporate "cross-point" interconnect matrices. Cross-point interconnect matrices include a plurality of parallel word (input) lines arranged perpendicular to a plurality of parallel bit (output) lines. At the intersections of the word lines and bit lines are programmable connection circuits. Each programmable connection includes a memory cell which is programmed to either connect or disconnect one word line to/from one bit line. The word lines receive signals input to the CPLD, and feedback signals from the macrocells. Selected bit lines are connected to the word lines via the programmable connections to route input and feedback signals into selected function blocks. Cross-point interconnect matrices are characterized in that every word line is programmably connectable to every bit line, thereby providing the advantage of 100% routability—that is, every word line can be connected to every bit line within a cross-point interconnect matrix. Another advantage of cross-point interconnect matrices is that two or more signals on the word lines can be logically ANDed together before transmission to the function blocks. Cross-point interconnect matrices are described in U.S. Pat. Nos. 5,028,821 and 5,530,378, which are incorporated herein by reference in their entirety.

Complex programmable logic devices are commonly used in field-programmable systems, i.e., systems whose operational characteristics are designed to be changed or upgraded after they leave the factory. Such systems, also known as embedded systems, utilize the well-known IEEE 1149.1 boundary-scan/JTAG interface to perform in-system testing and programming. Boundary-scan testing and programming is accomplished using a test access port (TAP) on the CPLD device, which is typically a set of four dedicated pins. The boundary-scan/JTAG standard is formally known as IEEE/ANSI standard 1149.1_1190, which is well known in the art and therefore not described in detail herein.

Today's complex systems, often consisting of multiple controllers and PLDS, use their controllers to perform in-system programming (ISP) of their CPLDs to adapt to new uses, expand system capability, or correct flaws or shortcomings. In these systems, programmable logic devices are connected in a chain or other topology with a master controller at the top of the chain. Programming includes erasure of existing programmable connections (e.g., logic and input/output paths), programming new connections, or verifying the existing programming. Generically, these programming operations are referred to as "non-mission" operations, in contradistinction to the "mission" operations, the activities for which the system is designed and programmed.

Power loss may occur at any time during mission or non-mission operations. In particular, power loss during programming operations may leave the CPLD in a partially unprogrammed state on power restoration. In such situations, the functional pins of the CPLD may be left in an undefined condition (i.e. either high, low, or floating). If these pins are connected to the address bus of the processor, for instance, the undefined state could preventing the processor from using the address bus to correctly address another device on the bus. Consequently, all system operations in general would be disrupted.

What is needed is an apparatus and a method of operation to ensure that the functional pins of a CPLD will remain in a safe, high impedance, floating (i.e., tri-state logic) condition in the event of power loss during non-mission operations and therefore will affect neither control nor operation of any busses or devices connected to the CPLD.

SUMMARY OF THE INVENTION

An apparatus and a method of operation for programming a programmable logic device (PLD) using a status bit to signal whether an in-system programming (ISP) operation has been completed is described. Systems utilizing a controller or processor often use PLDs to interface to other elements of the system and to the outside environment. Such PLDs are reprogrammed by the system controller using the boundary-scan/JTAG access port, but a power failure may cause an unwanted termination of the PLD programming cycle before all of the PLD's programmable connections defining the internal logic, signal paths, and I/O functional pins are properly programmed. In such a situation, some or all of the PLD functional pins could be driven to erroneous states such that other devices connected to them would be damaged or prevented from operating correctly. For instance, a PLD output pin connected to the processor address bus could be driven to a state that would prevent the processor from using the address bus to reprogram the PLD upon return of power.

In accordance with an embodiment of the present invention, a status indicator is set to hold all PLD functional pins in a high impedance (tri-state) condition until programming or another non-mission mode of PLD operation successfully concludes. In the event of an unexpected loss of power, the status indicator causes all PLD functional pins to come up in tri-state on restoration of power. The functional pins will therefore be unable to assert control of or improperly drive any other connected devices or busses.

BRIEF DESCRIPTION OF THE DRAWINGS

The present disclosure may be better understood, and its numerous objects, features, and advantages made apparent to those skilled in the art by referencing the accompanying drawings.

The use of the same reference symbols in different drawings indicates similar or identical items.

DETAILED DESCRIPTION OF THE DRAWINGS

Introduction

An apparatus to protect a programmable logic device from mis-programming due to a power outage during reprogramming, and a method of operation thereof, is disclosed. This relies on the logical sequence of programming the programmable locations defining the logic and interconnections of a CPLD to ensure complete erasure and programming of the device.

A brief description of the XC9500 CPLD series is provided below. Additional description of the XC9500 and XC9500XL CPLD series is provided on pages 3–5 to 3–19 of the *Programmable Logic Data Book,* 1998, published by XILINX, Inc., which is incorporated herein by reference. Note, however, that the present invention is not limited to the specific architecture of the XC9500 or XC9500XL series, and is applicable to any PLD.

CPLD Overview

Figure 1:
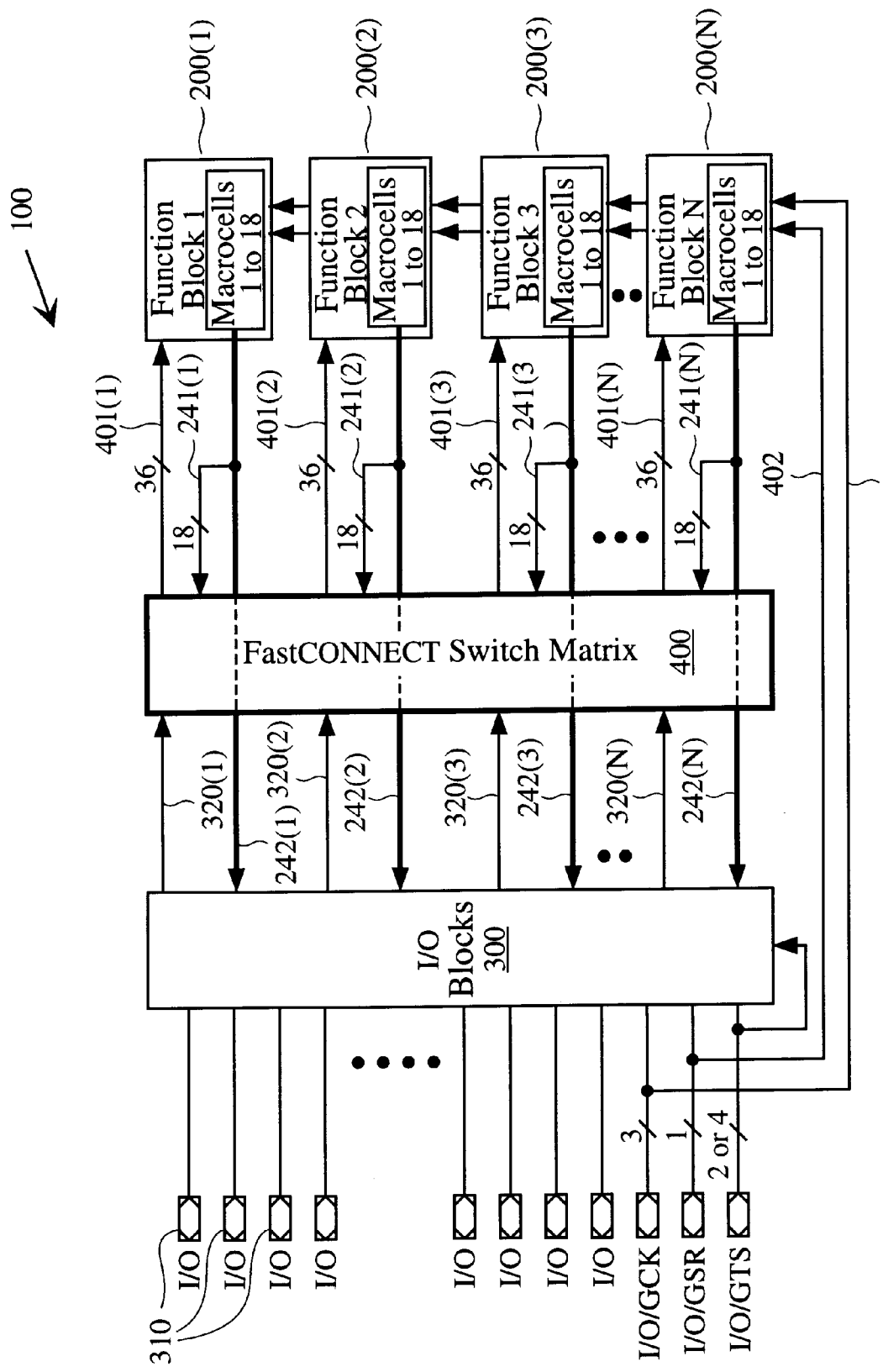
FIG. 1 is a high level block diagram of a prior art complex programmable logic device (CPLD) of the XILINX XC9500 family.

FIG. 1 is a block diagram of a CPLD 100 which includes features common to the XC9500 CPLD family. Each CPLD 100 of the XC9500 CPLD family consists of multiple function blocks (FBs) 200(1), 200(2), and 200(3) through 200(N) (four shown) and input/output (I/O) modules (blocks) 300 which are interconnected by a FastCONNECT™ Switch Matrix (FSM) (interconnect matrix) 400. I/O modules 300 provide buffering for device inputs and outputs which are applied to input/output (I/O) pins 310, also referred to as functional pins. All input signals from the I/O modules 300 enter FSM 400 via FSM input lines 320(1), 320(2), and 320(3) through 320(N) (four shown). Output signals from FBs 200 are either fed-back into FSM 400 on macrocell feedback lines 241(1), 241(2), and 241(3) through 241(n) (four shown), or transmitted to I/O modules 300 on macrocell output lines 242(1), 242(2), and 242(3) through 242(N) (four shown). Each FB 200 receives thirty-six (36) inputs on FB input lines 401(1), 401(2), and 401(3) through 401(N) (four shown) from FSM 400, and produces ninety (90) P-term elements which are applied to any of eighteen (18) macrocells, each macrocell being programmable to provide a sum-of-products term from selected P-term elements. For each FB 200, twelve to eighteen outputs are selectively transmitted on macrocell output lines 242 to directly drive I/O modules 300 (along with optional corresponding output enable signals). In addition, each FB 200 selectively receives a global set/reset signal and global clock signals on global set/reset line 402 and global clock lines 403, respectively.

Figure 2:
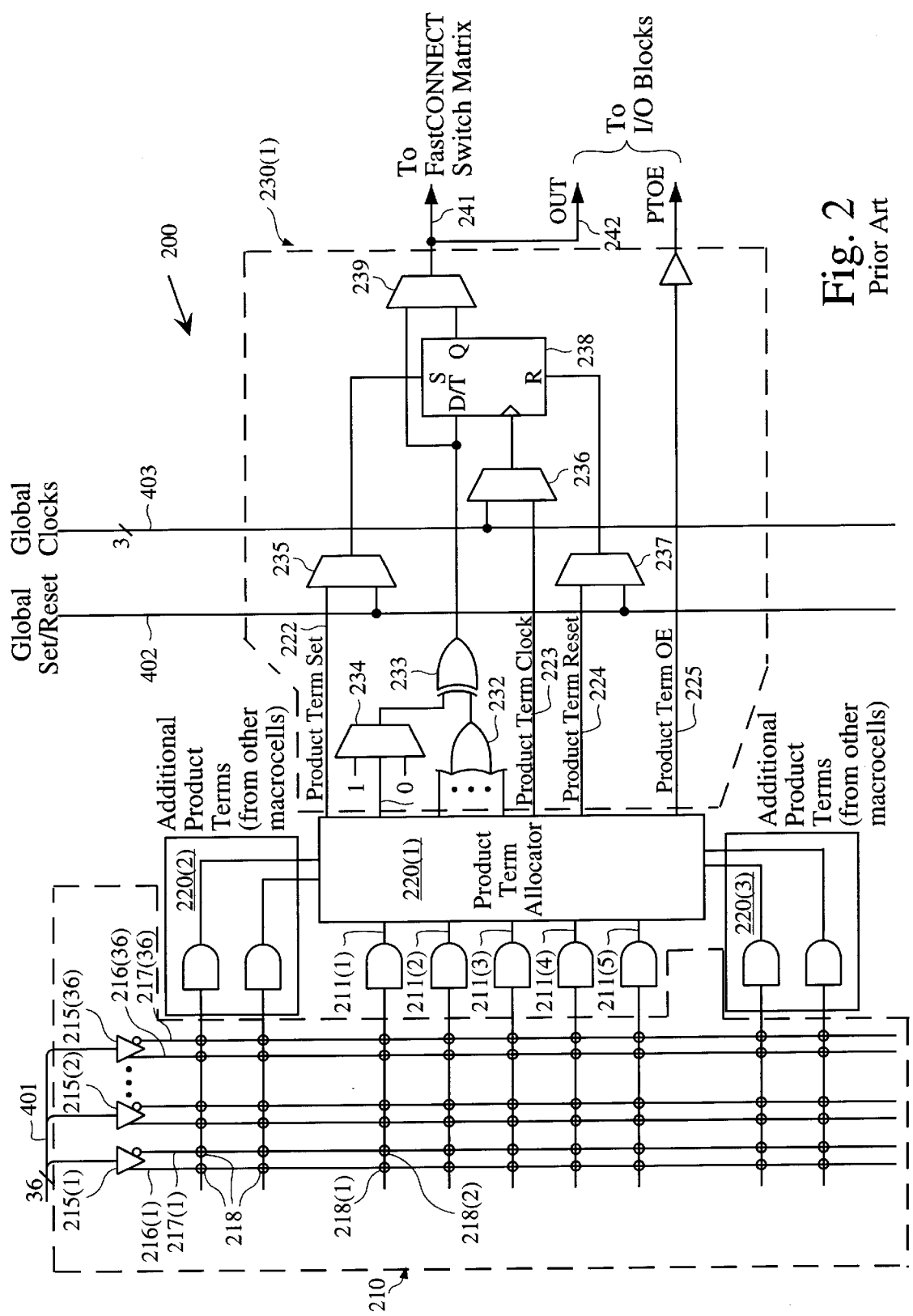
FIG. 2 is a simplified schematic diagram illustrating a portion of a function block (FB) of the prior art CPLD shown in FIG. 1.

FIG. 2 is a simplified schematic diagram showing a portion of one exemplary FB 200 from FIG. 1. Each FB 200 includes an AND array 210, product term allocators 220 and macrocells 230 (of which only macrocell 230(1) is shown).

CPLD 100 includes a selectively programmable signal inversion circuit for inverting signals output from FSM 400 such that each FSM output signal is selectively transmitted to a subsequent P-term in true (non-inverted) or complement (inverted) polarity. In CPLD 100, the selectively programmable signal inversion circuits are implemented by AND array 210 (FIG. 2). AND array 210 receives thirty-six (36)

input signals on input lines 401 from FSM 400 such that each input signal is applied to one of thirty-six (36) buffers 215(1) through 215(36). Each buffer 215(1) through 215(36) outputs a true (non-inverted) signal on an associated true AND-array line 216(1) through 216(36), and a complement (inverted) signal on an associated complement AND-array line 217(1) through 217(36). Each of the true AND-array lines 216(1) through 216(36) and complement AND-array lines 217(1) through 217(36) is programmably connectable to each P-term line 211 (nine shown) via a programmable connection 218 (discussed below). For example, true AND-array line 216(1) is connectable to P-term line 211(1) by programming a memory cell (not shown) associated with programmable connection 218(1). Alternatively, complement AND-array line 217(1) is connectable to P-term line 211(1) by programming a memory cell associated with programmable connection 218(2). By selectively connecting the AND-array line (216 or 217) associated with a particular input signal, a user controls the polarity of the signal applied to a selected P-term line 211. Of course, other selectively programmable signal inversion circuits may be used in place of the AND array/P-term line connection described above.

Eighteen product term allocators 220 programmably connect the ninety P-term lines 211 to the eighteen macrocells 230 of FB 200. In particular, product term allocators 220 programmably connect five "direct" P-term lines 211 and up to eighty-five (85) "imported" P-term lines 211 to a selected macrocell 230. For example, referring to FIG. 2, product term allocator 220(1) is programmable to connect P-term lines 211(1) through 211(5) to OR gate 232, exclusive-OR (XOR) gate 233 (on XOR multipexer [MUX] line 221 and through XOR MUX 234), to Set MUX 235 (on P-term set line 222), to Clock MUX 236 (on P-term clock line 223), to Reset MUX 237 (on P-term reset line 224), and to provide the optional OE signal (on P-term output-enable line 225). In addition, product term allocator 220(1) selectively applies "imported" P-term lines from neighboring product term allocators 220(2) and 220(3) to OR gate 232.

Within macrocell 230(1), XOR MUX 234 is programmable to apply the signal on XOR MUX line 221, a logic "1", or a logic "0" to a first input terminal of XOR gate 233. OR gate 232 generates a sum-of-products term which is applied to the second input terminal of XOR gate 233. The output of XOR gate 233 is selectively transmitted through D/T flip-flop (D/T FF) 238 and FF MUX 239 as a registered output signal, or directly through FF MUX 239 as a combinatorial output signal transmitted on macrocell feedback line 241 or macrocell output line 242. The remaining P-term lines selectively provide optional control signals for D/T FF 238 (when a registered output signal is generated), and/or provide optional output enable (OE) control (when the output is directed to an I/O pin 310, shown in FIG. 1). Specifically, Set MUX 235 selectively passes the signal on P-term set line 222 or a global set signal (received on one of the global set/reset lines 402) to the set (S) terminal of D/T flip-flop 238. Clock MUX 236 selectively passes the signal on P-term clock line 223 or a global clock signal (received on one of the global clock lines 403) to the clock (>) terminal of D/T flip-flop 238. Reset MUX 237 selectively passes the signal on P-term reset line 224 or a global reset signal (received on one of the global set/reset lines 402) to the reset (R) terminal of D/T flip-flop 238. Finally, as discussed above, P-term OE line 225 is directed to one of the I/O modules 300 (see FIG. 1).

Figure 3:
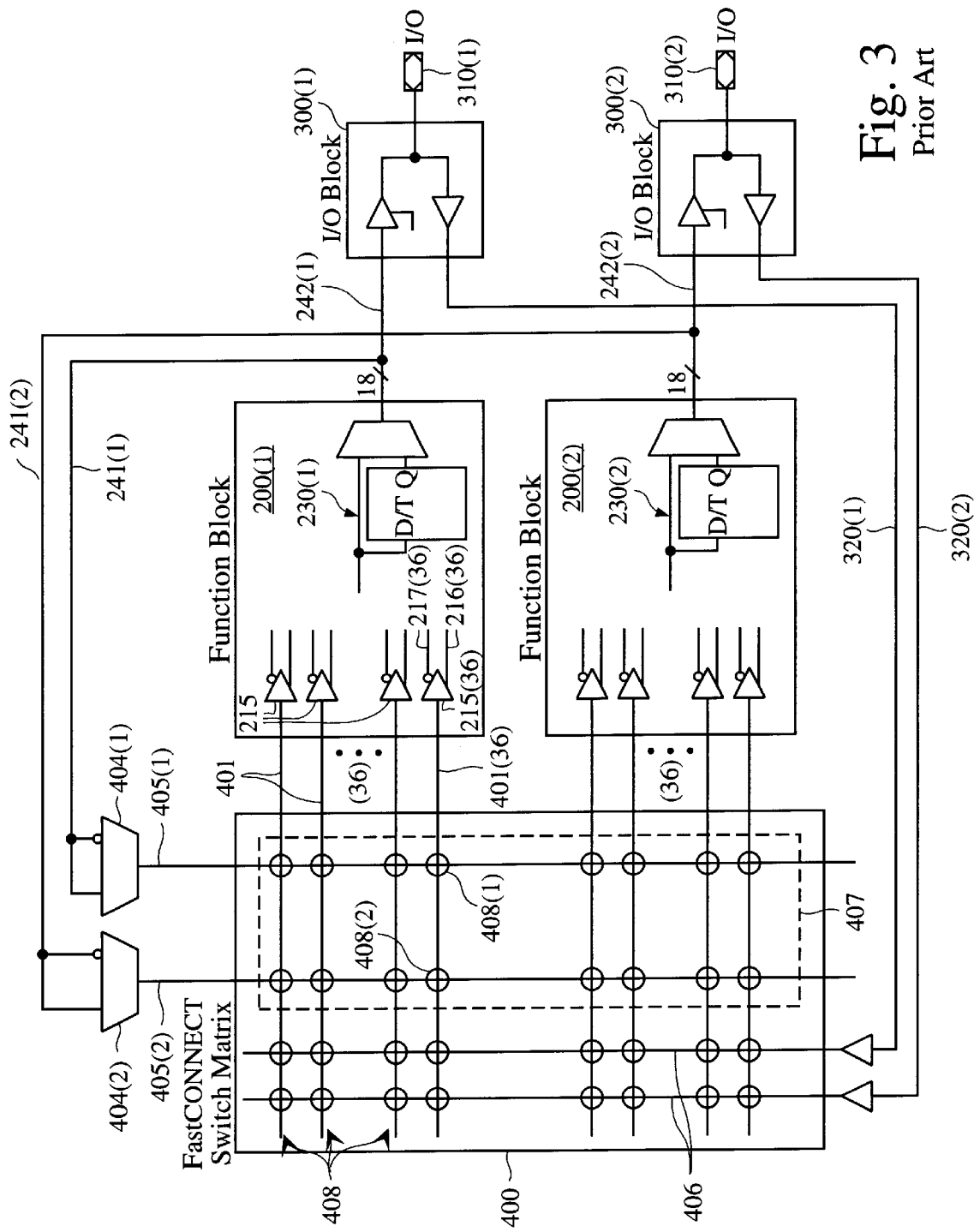
FIG. 3 is a simplified schematic diagram illustrating an interconnect matrix of the prior art CPLD shown in FIG. 1.

FIG. 3 is a simplified circuit diagram illustrating the operation of FSM 400. Feedback signals from macrocells 230(1) and 230(2) of FBs 200(1) and 200(2) are transmitted via macrocell feedback lines 241(1) and 241(2), respectively, to FSM input (word) lines 405(1) and 405(2) via FSM input MUXs 404(1) and 404(2). Input signals from I/O modules 300(1) and 300(2) are respectively transmitted on input lines 320(1) and 320(2) to FSM input (word) lines 406. All of FSM input lines 405 and 406 are programmably connected to each of the FSM output (bit) lines 401 via programmable connection circuits 408 (discussed below). As discussed above, FSM output lines 401 transmit signals to buffers 215 of FBs 200(1) and 200(2).

A second selectively programmable signal inversion circuit is provided for inverting feedback signals such that each feedback signal on feedback lines 241 is selectively transmitted into FSM 400 in true or complement polarity. Specifically, the second selectively programmable signal inversion circuits are implemented by FSM input MUXs 404. Each FSM input MUX 404 is connected between one feedback line 241 and one FSM input line 405. The select input to each FSM input MUX 404 is programmed by a memory cell (not shown) to apply a true (non-inverted) or a complement (inverted) feedback signal on an associated FSM input line 405. Of course, other selectively programmable signal inversion circuits may be used in place of FSM input MUXs 404.

Figure 4:
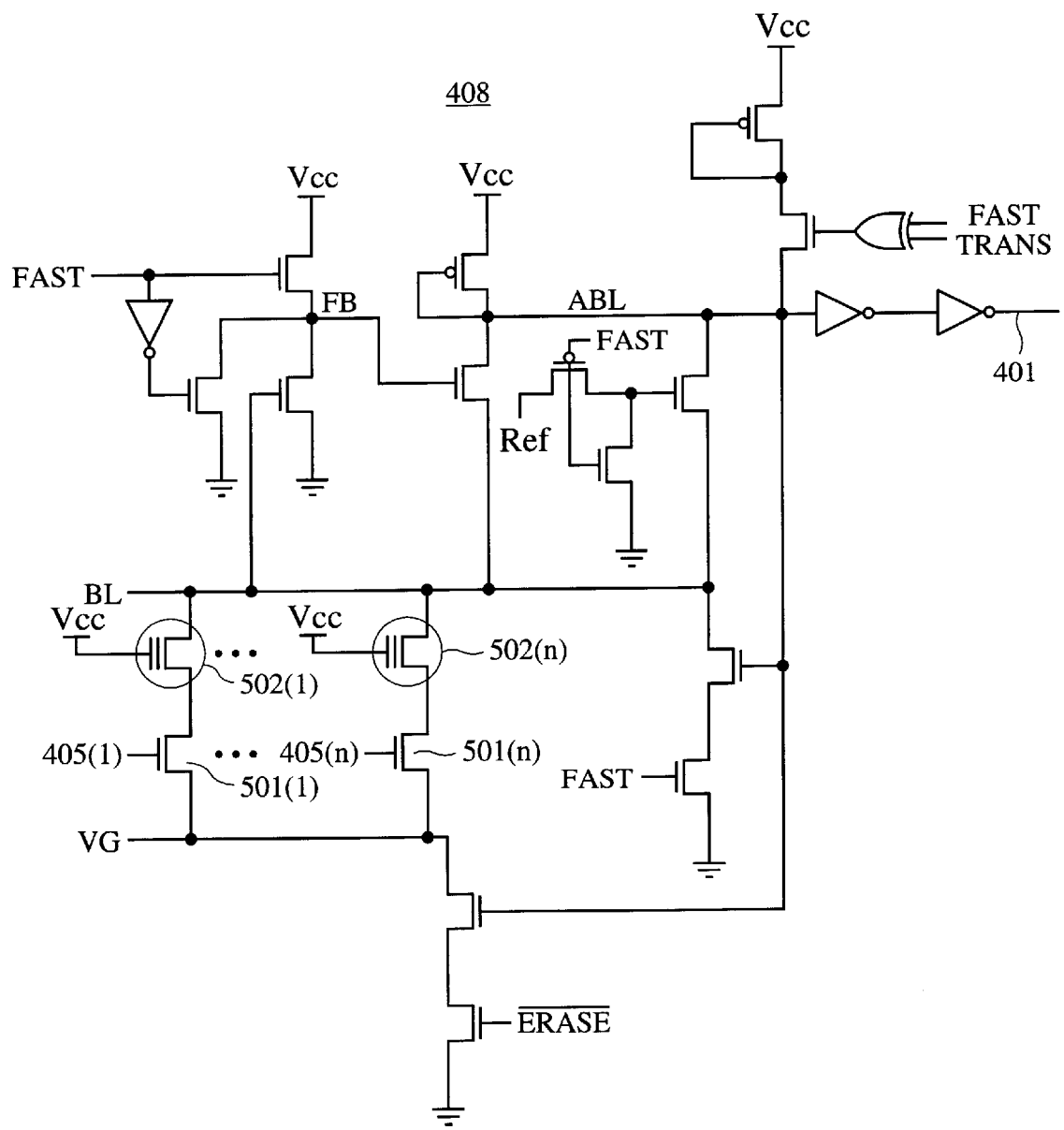
FIG. 4 is a simplified schematic diagram of a programmable connection circuit utilized in the interconnect matrix of the prior art CPLD shown in FIG. 1.

FIG. 4 shows a programmable connection circuit 408 used in accordance with an embodiment of the present invention. The operation and function of the disclosed programmable connection circuit 408 is provided in commonly-assigned U.S. Pat. No. 5,617,041, which is incorporated herein by reference. Each of FSM input lines 405(1) through 405(n) is coupled to the gate of one access transistor 501(1) through 501(n). The source of each access transistor 501(1) through 501(n) is connected to virtual ground line VG. EPROM cells 502(1) through 502(n) are respectively connected between access transistors 501(1) through 501(n) and bit line BL, and include control gates connected to internal power bus Vcc.

In operation, one or more selected FSM input lines 405(1) through 405(n) are connected to bit line BL by erasing (rendering conductive) an associated EPROM cell 502 using methods known in the art. For example, EPROM 502(1) is erased to connect FSM input line 405(1) to bit line BL, and a subsequent high signal on FSM input line 405(1) turns on access transistor 501(1), thereby connecting bit line BL to ground through EPROM 502(1) and access transistor 501 (1). When bit line BL is pulled low, FSM output line 401 is also pulled low. Further, FSM 400 can be utilized to perform logic AND functions of two or more feedback signals by connecting the associated FSM input lines 405(1) through 405(n) to bit line BL by erasing the associated EPROM cells 502(1) through 502(n). When any of the connected feedback signals is high, the FSM output line 401 is switched to low—that is, FSM output line 401 remains high only if all of the connected feedback lines are low. This feature is used to implement logic AND operations within FSM 400, thereby potentially permitting use of macrocells 200 for other logic operations of a user's logic function.

Protection Cells

In one embodiment of the present invention, a programmable logic device (PLD)(such as one of the Xilinx XC9500 family of devices discussed above) is provided with two additional, redundant programmable locations to ensure the device is completely programmed or erased. The circuits are redundant in the sense that, in one embodiment, they are programmable locations identical in structure to all other programmable locations in the device.

Programming a PLD typically begins with a blank device. The blank device is provided by erasing a memory space 505

(FIG. 5A) in the device. This erasing is done serially by blocks of memory, starting at one "end" of memory space 505 (e.g., with the lowest numbered address, such as 0x) and proceeding block-wise to the other "end," erasing blocks of memory in turn. Note that the term "memory space" may refer to the sequential designation of all programmable locations in the device, including configuration memory cells (such as memory cells 502 (FIG. 4) as well as all control logic in the device (memory cells controlling multiplexers and flip-flops, for example) or a subset of the programmable locations in the device. Note further that the term "memory block" may denote a single memory cell or any predetermined set of memory cells.

To erase a programmable location, the associated non-volatile memory cell is placed in a conductive state; the resulting state of the programmable location represents the defined state ERASED. For purposes of this description, an ERASED state is denoted as a logic zero. After erasure of all programmable locations is accomplished, the programmable locations are programmed in series as in the erasing operation.

Figure 5A:
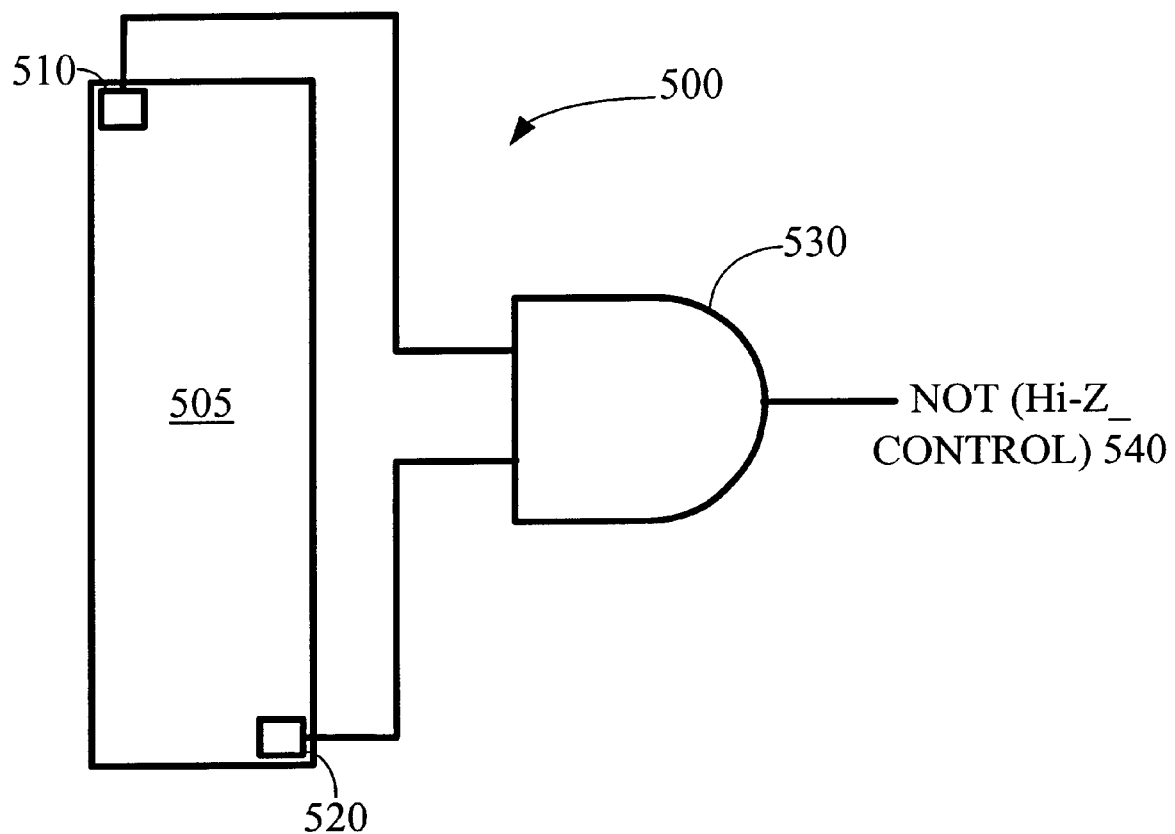
FIG. 5A is a high level block diagram of a programmable logic device in accordance with one embodiment of the present invention.

The first of these redundant programmable locations, designated first programmable location 510 in FIG. 5A, is the first location to be erased in every programming operation. Note that in in-system programmable devices, programming is always preceded by erasing.

The second of these redundant programmable locations, designated last programmable location 520, is the last location to be programmed in every programming operation. Of importance, both first and second programmable locations are always programmed to NOT(ERASED).

First programmable location 510 and last programmable location 520 are connected as shown in FIG. 5A to the input terminals of an AND gate 530 (or an equivalent logic element or elements). If either location 510 or 520 is ERASED (logic 0), the output signal of AND gate 530, NOT(Hi-Z)__Control signal 540, is also a logic 0. This logic 0 output signal, in the embodiment of the present invention described in more detail in reference to FIG. 5B, denotes that functional pins 310 (FIG. 1) are latched in a high impedance, tri-state mode. In accordance with the present invention, all functional pins 310 are held in a tri-state mode until the programming phase is complete. If both locations 510 and 520 are programmed (logic 1), then the output signal of AND gate 530 is a logic 1, thereby releasing functional pins 310 from the tristate mode.

Figure 5B:
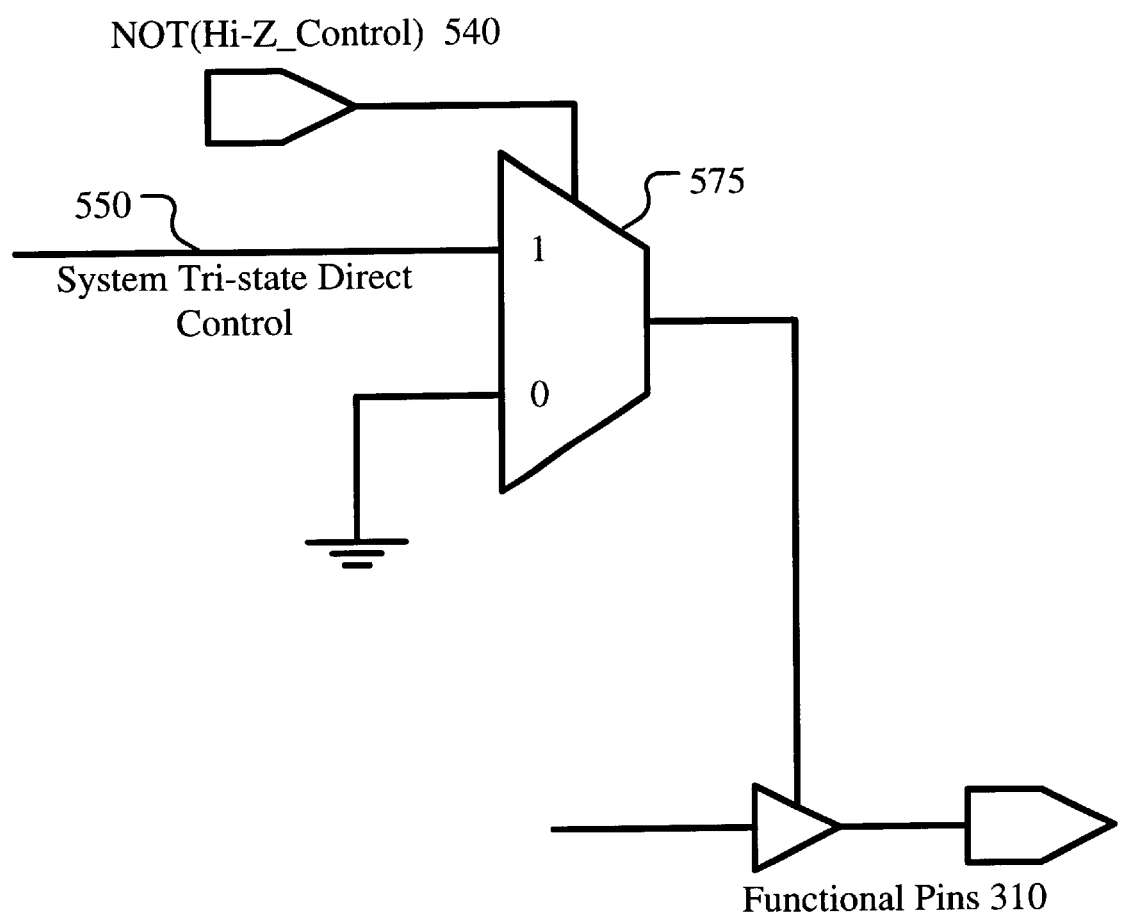
FIG. 5B is a high level schematic diagram of a tri-state control circuit in accordance with one embodiment of the present invention.

The tri-state mode of functional pins 310 is enabled/disabled by circuitry 560 of FIG. 5B. Circuitry 560 includes a multipexer 575 and a non-inverting, active high tristate buffer 580. In this embodiment, if multipexer 575 outputs a logic 0, then tristate buffer 580 enters a high-impedance, disconnected state. If instead multipexer 575 outputs a logic 1, then tristate buffer 580 behaves like an ordinary buffer.

When signal NOT(Hi-Z__Control) is a logic 0 (i.e. one or both of programmable locations 510 and 520 is erased), then multipexer 575 connects the data on its "0" input terminal to the enable terminal of tristate buffer 580. Because the input terminal "0" is connected to ground, a logic 0 is provided to the enable terminal of tristate buffer 580, thereby ensuring that functional pin 310(x) is in a tristate mode.

If signal NOT (Hi-Z__Control) is a logic 1 (i.e. both of programmable locations 510 and 520 are programmed), then multipexer 575 connects the data on its "1" input terminal to the enable terminal of tristate buffer 580. Specifically, the "1" input terminal receives a system level tri-state direct control signal 550 which can force a tri-state mode on pins 310 irrespective of the erasing/programming states of the programmable locations. Thus, functional pin 310(x) is forced into tri-state mode only if tri-state direct control signal 550 is a logic 0, otherwise functional pin 310(x) operates in a standard operating mode. Note that tri-state direct control signal 550 may be a local product term (signal PTOE in FIG. 2), thereby designating an individual functional pin 310(x) to be in a tri-state mode, or a global signal (see, for example, signal Global OE described in the 1999 Xilinx Data Book, pages 5-14 and 5-15), thereby designating all functional pins to be placed in a tri-state mode.

Therefore, in accordance with the present invention, a status indicator is set to hold one or more PLD functional pins in a high impedance (tri-state) condition until programming or another non-mission mode of PLD operation successfully concludes. In the event of an unexpected loss of power, the status indicator causes all PLD functional pins to come up in tri-state on restoration of power. The functional pins will therefore be unable to assert control of or improperly drive any other connected devices or busses. Note that in one embodiment, a pull-up transistor of 50 K Ohms is provided between buffer 580 and functional pin 310(x), thereby providing a logic one signal to system components connected to the PLD.

Figure 6A:
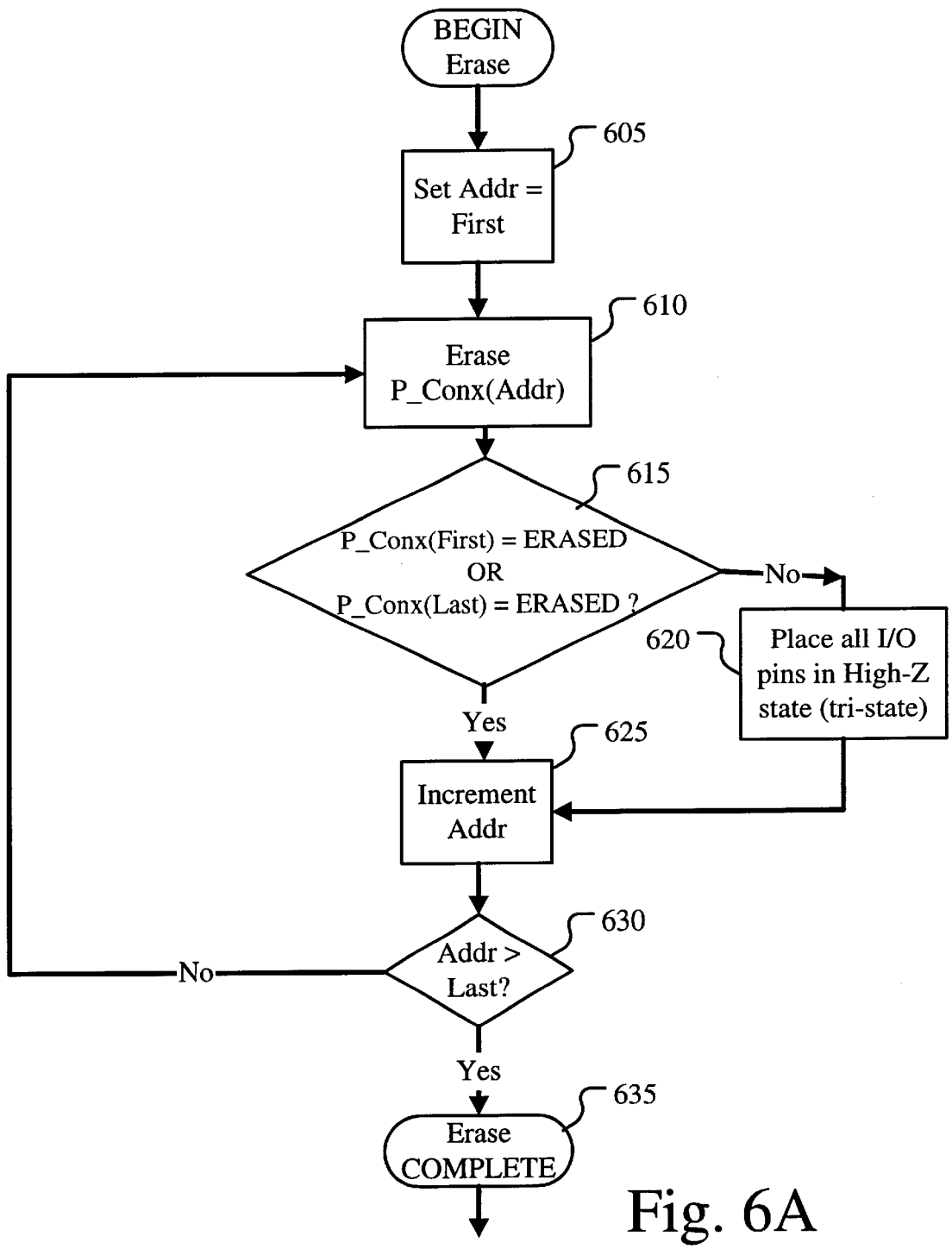
FIG. 6A is a flowchart of the erase steps in the programming process of the present invention.
Figure 6B:
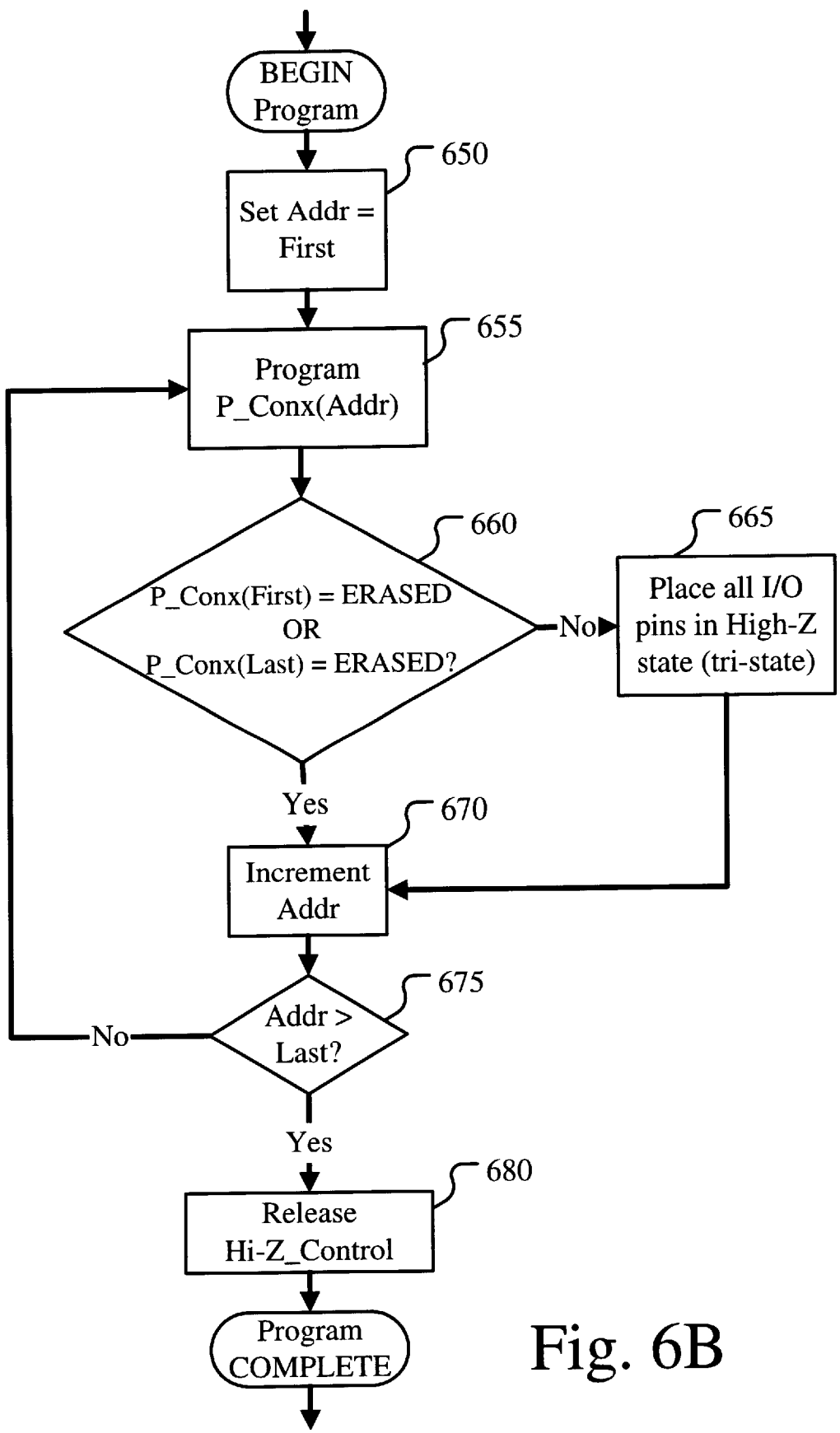
FIG. 6B is a flowchart of the program steps in the programming process of the present invention.

FIGS. 6A and 6B respectively illustrate the erasing and subsequent programming process. In FIG. 6A, the erasing process begins by selecting the address location of first programmable location 510 ("First") in step 605. In step 610, the programmable location at that address is erased (i.e., set to state ERASED (logic 0)). The states of first programmable location 510 and last programmable connection 520 are compared in step 615. If either programmable location is in the ERASED state, then all functional pins 310 are placed in a tri-state mode in step 620. Then, the address in memory space 505 (FIG. 5A) is incremented in step 625. If the new address is not greater than the last address, then the process loops back to step 610 to erase the programmable location at the new address. However, if the new address is greater than the last address, as determined in step 630, then all programmable locations have been erased and erasing stops (step 635).

Note that because an AND gate 530 (FIG. 5A) is used in one embodiment to implement decision step 615 and decision step 615 follows erase step 610, the "yes" path is always chosen. Further note that the user may desire to erase the device without re-programming. In such cases, operation ceases at step 635.

In FIG. 6B, the programming process begins by selecting the address location of first programmable location 510 ("First") in step 650. In step 655, the programmable location at that address is programmed (i.e., set to state NOT ERASED (logic 1)). The states of first programmable location 510 and last programmable connection 520 are compared in step 660. If either programmable location is in the ERASED state, then all functional pins 310 are placed in a tri-state mode in step 665. Then, the address in memory space 505 (FIG. 5A) is incremented in step 670. If the new address is not greater than the last address, then the process loops back to step 655 to program the programmable location at the new address. However, if the new address is greater than the last address, as determined in step 675, then all programmable locations have been programmed. At this point, step 677 determines if system tristate direct control is asserted. If asserted, then the I/O pins remain in a tri-state mode (step 678). If not asserted, then functional pins 310 are released from their tri-state mode and enter standard operating mode (step 680).

Figure 6C:
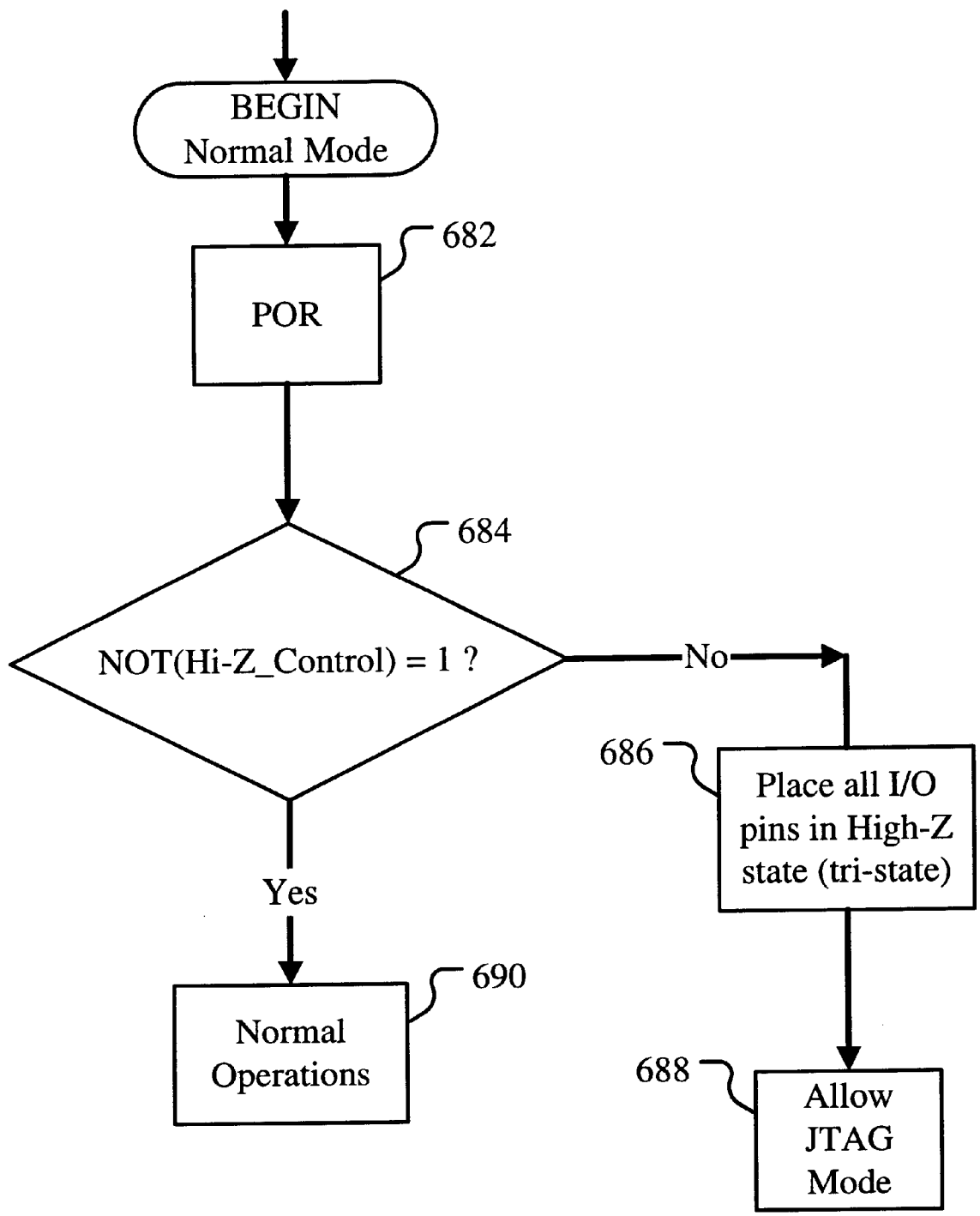
FIG. 6C is a flowchart of normal operations of the present invention.

FIG. 6C presents the flow of normal operations, starting from power-on reset (POR) 682. Step 684 first tests to see if Hi-Z_Control is asserted. If it is (i.e., NOT(Hi-Z_Control)=0), then I/O pins 310 are placed in tri-state. Otherwise, (NOT(Hi-Z_Control)=1), CPLD 100 operates as programmed.

In an alternate embodiment, steps 615 and 620 (FIG. 6A) are omitted. A new step (not shown) is then inserted before step 605 wherein all programmable connections are erased and I/O pins 310 are placed in tri-state.

In a further alternate embodiment, the NOT(Hi-Z_Control) signal 540 (referring to FIG. 5A) is used to disable other elements, such as the memory sense amplifiers (not shown) of CPLD 100 and force their outputs to a pre-defined state, to prevent additional bus drive contention problems. In this way, CPLD elements left in a bad state by power loss will not cause bus contention on power restoration, as by having one sense amplifier trying to pull a bus high while another simultaneously attempts to pull the same bus low.

The present invention thus protects the programmable logic device from mis-programming, e.g., due to a power outage during reprogramming. In so doing, the invention prevents the possibility of an in-system programming event aborted by a power failure leaving the device in a state that would prevent further re-programming, thereby crippling the whole system.

While particular embodiments of the present invention have been shown and described, it will be apparent to those skilled in the art that changes and modifications may be made without departing from this invention in its broader aspects and, therefore, the appended claims are to encompass within their scope all such changes and modifications as fall within the true spirit and scope of this invention.

What is claimed is:

1. An apparatus for programming a programmable logic device having a plurality of functional connections and comprising:
    a status indicator wherein said indicator is set on initiation of a programming mode of said programmable logic device and said indicator is cleared on termination of the programming mode;
    circuitry connected to said indicator and which holds said functional connections in a high impedance state when said indicator is set; and
    circuitry connected to said indicator and which places said functional connections in a programmed state when said indicator is cleared.

2. The apparatus according to claim 1 wherein said functional connections are sequential and said status indicator is set when either a first of said functional connections or a last of said functional connections is in a programmed state.

3. The apparatus according to claim 1 wherein said programmable logic device further comprises:
    a plurality of driver elements;
    circuitry connected to said indicator and which disables at least one of said driver elements when said indicator is set; and
    circuitry connected to said indicator and which places said disabled driver elements in an operational state when said indicator is cleared.

4. A method of programming a programmable logic device having a plurality of functional connections, comprising the acts of:
    initiating a programming mode of the programmable logic device;
    setting a status indicator;
    placing said functional connections in a high impedance state when said indicator is set;
    programming a commanded state for each of said functional connections;
    terminating said programming mode;
    clearing said status indicator when said programming mode is terminated; and
    placing each of said functional connections into said commanded state upon said clearing.

5. The method according to claim 4 wherein said setting said status indicator comprises:
    comparing a state of a first of said functional connections to a state of a last of said functional connections; and
    setting said status indicator when either said first functional connection or said last functional connection is in a programmed state.

6. The method according to claim 4 wherein said programmable logic device has a plurality of driver elements and further comprising:
    disabling at least one of said driver elements when said indicator is set; and
    placing said disabled driver elements into an operational state upon said clearing.

7. An apparatus for programming a device having a plurality of sequential programmable elements and a plurality of input/output pins and comprising:
    a first connection to a first of said programmable elements;
    a second connection to a last of said programmable elements;
    a logic circuit having its input terminals connected to said first connection and said second connection and having an output terminal;
    wherein a first state of the logic circuit on its output terminal sets the input/output pins to a programming mode and a second state of the logic circuit on its output terminal sets the input/output pins to a non-programming mode.

8. The apparatus of claim 7 wherein said programmable elements are memory locations.

9. The apparatus of claim 7 wherein said logic circuit includes an AND gate and the first state is provided when both said first and last programmable elements are in an erased state.

* * * * *